US012573585B2

(12) United States Patent
Sato et al.

(10) Patent No.: US 12,573,585 B2
(45) Date of Patent: Mar. 10, 2026

(54) CHARGED PARTICLE BEAM WRITING APPARATUS, CHARGED PARTICLE BEAM WRITING METHOD, AND PHASE DIFFERENCE PLATE ADJUSTMENT METHOD

(71) Applicant: NuFlare Technology, Inc., Yokohama (JP)

(72) Inventors: Yasutaka Sato, Hachioji (JP); Yuto Asakura, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 343 days.

(21) Appl. No.: 18/460,139

(22) Filed: Sep. 1, 2023

(65) Prior Publication Data

US 2024/0096590 A1 Mar. 21, 2024

(30) Foreign Application Priority Data

Sep. 20, 2022 (JP) ................................ 2022-149290

(51) Int. Cl.
*H01J 37/20* (2006.01)
*G01B 11/02* (2006.01)
(Continued)

(52) U.S. Cl.
CPC ............ *H01J 37/244* (2013.01); *G01B 11/02* (2013.01); *H01J 37/20* (2013.01); *H01J 37/3045* (2013.01);
(Continued)

(58) Field of Classification Search
CPC ...... H01J 37/244; H01J 37/20; H01J 37/3045; H01J 37/3174; H01J 2237/202;
(Continued)

(56) References Cited

U.S. PATENT DOCUMENTS 6,392,243 B1 5/2002 Muraki
6,864,488 B2 3/2005 Muraki
(Continued)

FOREIGN PATENT DOCUMENTS

JP 2000-49071 A 2/2000
JP 2002-151401 A 5/2002
(Continued)

OTHER PUBLICATIONS

Combined Taiwanese Office Action and Search Report issued May 15, 2024, in corresponding Taiwanese Patent Application No. 112130577 (with English Translation and English Translation of Category of Cited Documents, 19 pages.

*Primary Examiner* — Sean M Luck
(74) *Attorney, Agent, or Firm* — Oblon, McClelland, Maier & Neustadt, L.L.P.

(57) ABSTRACT

In one embodiment, a length measurer includes a first laser interferometer provided in a wall surface of the writing chamber, synthesizes a laser beam with the first frequency which has traveled back and forth between the first laser interferometer and the stage and a laser beam with the second frequency reflected in the first laser interferometer, and outputs a first beat signal. A wall surface displacement measurer includes a second laser interferometer provided in the wall surface of the writing chamber, synthesizes a laser beam with the first frequency which has traveled back and forth between the second laser interferometer and a fixed mirror and a laser beam with the second frequency reflected in the second laser interferometer, and outputs a second beat signal. The position of the stage is calculated based on a difference between the first beat signal and the second beat signal.

12 Claims, 5 Drawing Sheets

(51) Int. Cl.
  *H01J 37/244*        (2006.01)
  *H01J 37/304*        (2006.01)
  *H01J 37/317*        (2006.01)
(52) U.S. Cl.
  CPC ..... *H01J 37/3174* (2013.01); *H01J 2237/202*
        (2013.01); *H01J 2237/2446* (2013.01); *H01J*
                    *2237/24578* (2013.01)
(58) Field of Classification Search
  CPC .... H01J 2237/2446; H01J 2237/24578; G01B
                                    11/02
  See application file for complete search history.

(56)                    References Cited

U.S. PATENT DOCUMENTS

| | | | | |
|---|---|---|---|---|
| 8,277,603 | B2 * | 10/2012 | Tamamushi .......... | H01J 37/304 |
| | | | | 118/712 |
| 2013/0020502 | A1 * | 1/2013 | Koya ..................... | B82Y 10/00 |
| | | | | 250/453.11 |
| 2019/0361124 | A1 * | 11/2019 | Ogawa .................. | G01S 7/4811 |

FOREIGN PATENT DOCUMENTS

| | | | |
|---|---|---|---|
| JP | 2016-157968 | A | 9/2016 |
| JP | 6780441 | B2 | 11/2020 |

* cited by examiner

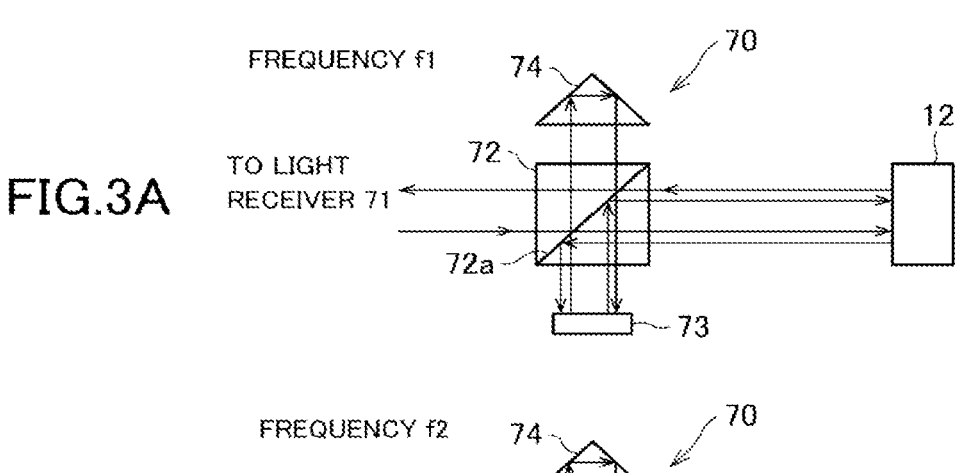
FIG.3A
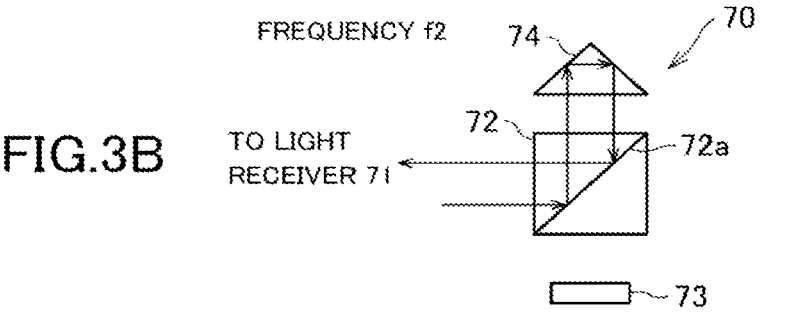
FIG.3B
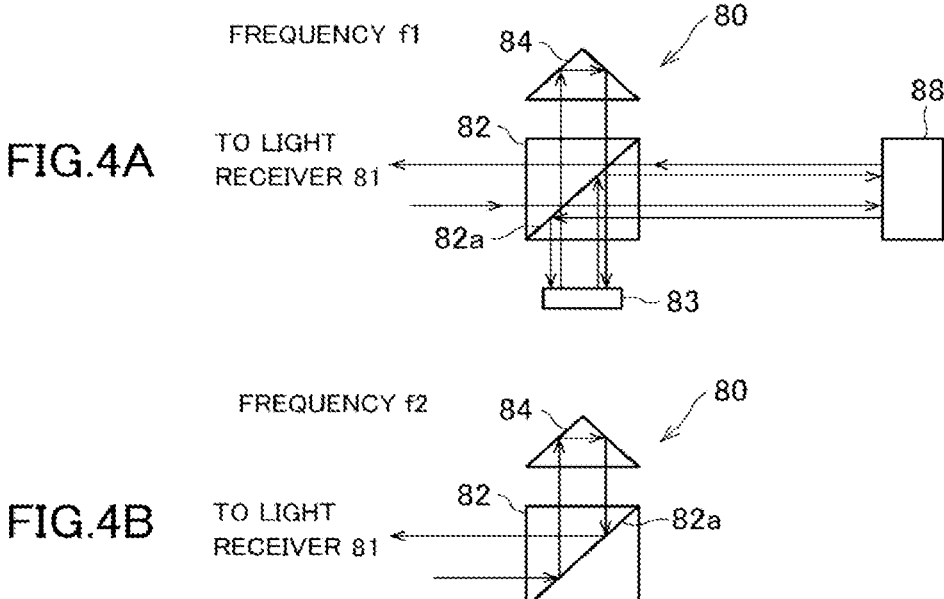
FIG.4A
FIG.4B

TIME OF WRITING PROCESS
FREQUENCY f1
FIG.5A
TO LIGHT
RECEIVER 71
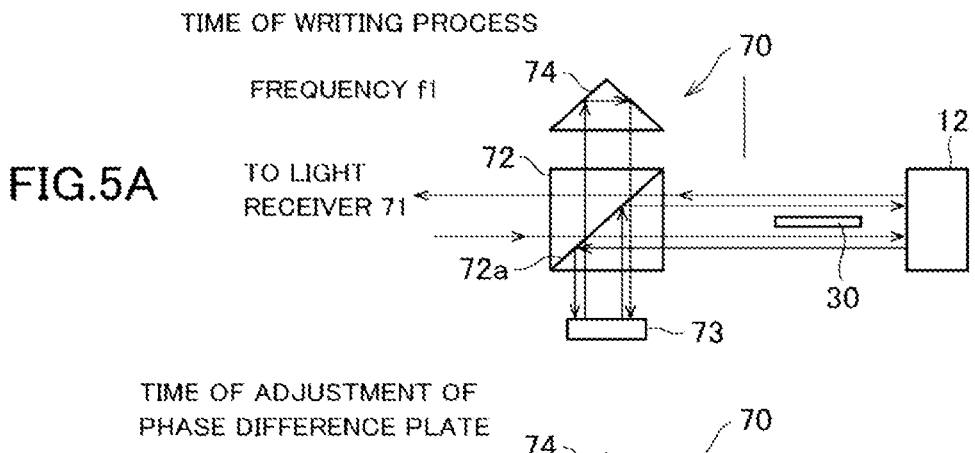
TIME OF ADJUSTMENT OF
PHASE DIFFERENCE PLATE
FREQUENCY f1
FIG.5B
TO MEASURING
DEVICE
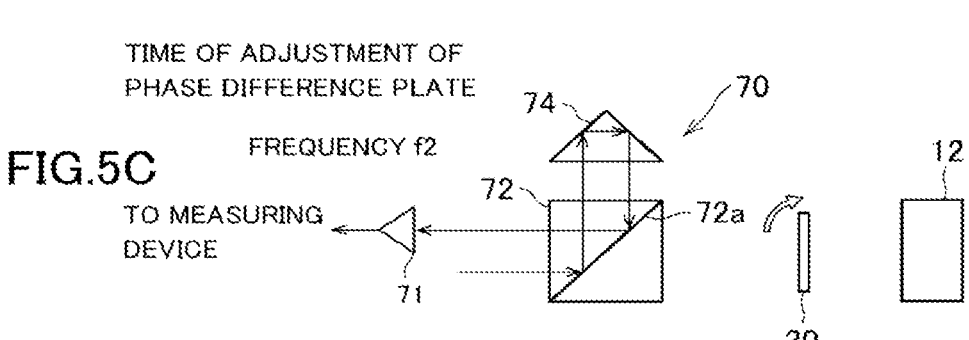
TIME OF ADJUSTMENT OF
PHASE DIFFERENCE PLATE
FREQUENCY f2
FIG.5C
TO MEASURING
DEVICE

TIME OF WRITING PROCESS

FREQUENCY f1

TO LIGHT
RECEIVER 81

TIME OF ADJUSTMENT OF
PHASE DIFFERENCE PLATE

FREQUENCY f1

TO MEASURING
DEVICE

TIME OF ADJUSTMENT OF
PHASE DIFFERENCE PLATE

FREQUENCY f2

TO MEASURING
DEVICE

CHARGED PARTICLE BEAM WRITING APPARATUS, CHARGED PARTICLE BEAM WRITING METHOD, AND PHASE DIFFERENCE PLATE ADJUSTMENT METHOD

CROSS REFERENCE TO RELATED APPLICATION

This application is based upon and claims benefit of priority from the Japanese Patent Application No. 2022-149290, filed on Sep. 20, 2022, the entire contents of which are incorporated herein by reference.

FIELD

The present invention relates to a charged particle beam writing apparatus, a charged particle beam writing method, and a phase difference plate adjustment method.

BACKGROUND

As LSI circuits are increasing in density, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

A conventional electron beam writing apparatus deflects an electron beam based on the position of a stage on which a substrate as a writing target is placed while moving the stage in a vacuum chamber, and radiates the electron beam to a desired position on the substrate to write a pattern. An actuator that drives the stage is fixed to the wall surface of the vacuum chamber.

A laser interferometer is used to measure the position of the stage. The laser interferometer has a plurality of optical components, such as a polarizing beam splitter fixed to the wall surface of the chamber, a λ/4 plate, and a reflecting mirror. When a laser beam is incident to the polarizing beam splitter, the laser beam is divided into a measuring beam (length measuring beam) to the stage and a reference beam to the reflecting mirror. The measuring beam reflected on the stage and the reference beam reflected by the reflecting mirror are synthesized by the polarizing beam splitter to form an interference beam. The stage position is measured from an interference fringe generated by the optical path difference between the measuring beam and the reference beam.

The chamber wall surface to which the polarizing beam splitter is fixed constantly undergoes deformation on the order of sub nm to several nm by an environmental change such as an atmospheric pressure variation and a temperature variation, and the stage drive reaction force of the actuator. When the position of the polarizing beam splitter varies due to deformation of the chamber wall surface, a measurement error may occur in the stage position, and the writing accuracy may be reduced.

BRIEF DESCRIPTION OF THE DRAWINGS

FIG. 3A, FIG. 3B are views illustrating an optical path of a laser beam.

FIG. 4A, FIG. 4B are views illustrating an optical path of a laser beam.

FIG. 5A, FIG. 5B, FIG. 5C are views illustrating an optical path of a laser beam.

DETAILED DESCRIPTION

In one embodiment, a charged particle beam writing apparatus includes a writer radiating a charged particle beam to a sample to write a pattern, the writer including a writing chamber in which a movable stage for placing the sample is internally installed, a laser source outputting a laser beam with a first frequency and a second frequency, a length measurer measuring a position of the stage using the laser beam with the first frequency and the second frequency, a wall surface displacement measurer measuring a wall surface displacement of the writing chamber using the laser beam with the first frequency and the second frequency, and a writing controller controlling the writer. The length measurer includes a first laser interferometer provided in a wall surface of the writing chamber, and detects a first synthetic beam and outputs a first beat signal, the first synthetic beam being obtained by synthesizing a laser beam with the first frequency which has traveled back and forth between the first laser interferometer and the stage, and a laser beam with the second frequency reflected in the first laser interferometer. The wall surface displacement measurer includes a second laser interferometer provided in the wall surface of the writing chamber, and detects a second synthetic beam and outputs a second beat signal, the second synthetic beam being obtained by synthesizing a laser beam with the first frequency which has traveled back and forth between the second laser interferometer and a fixed mirror fixed at a predetermined position in the writing chamber, and a laser beam with the second frequency reflected in the second laser interferometer. The writing controller calculates the position of the stage based on a difference between the first beat signal and the second beat signal.

An embodiment of the invention will be described with reference to the drawings.

Figure 1:
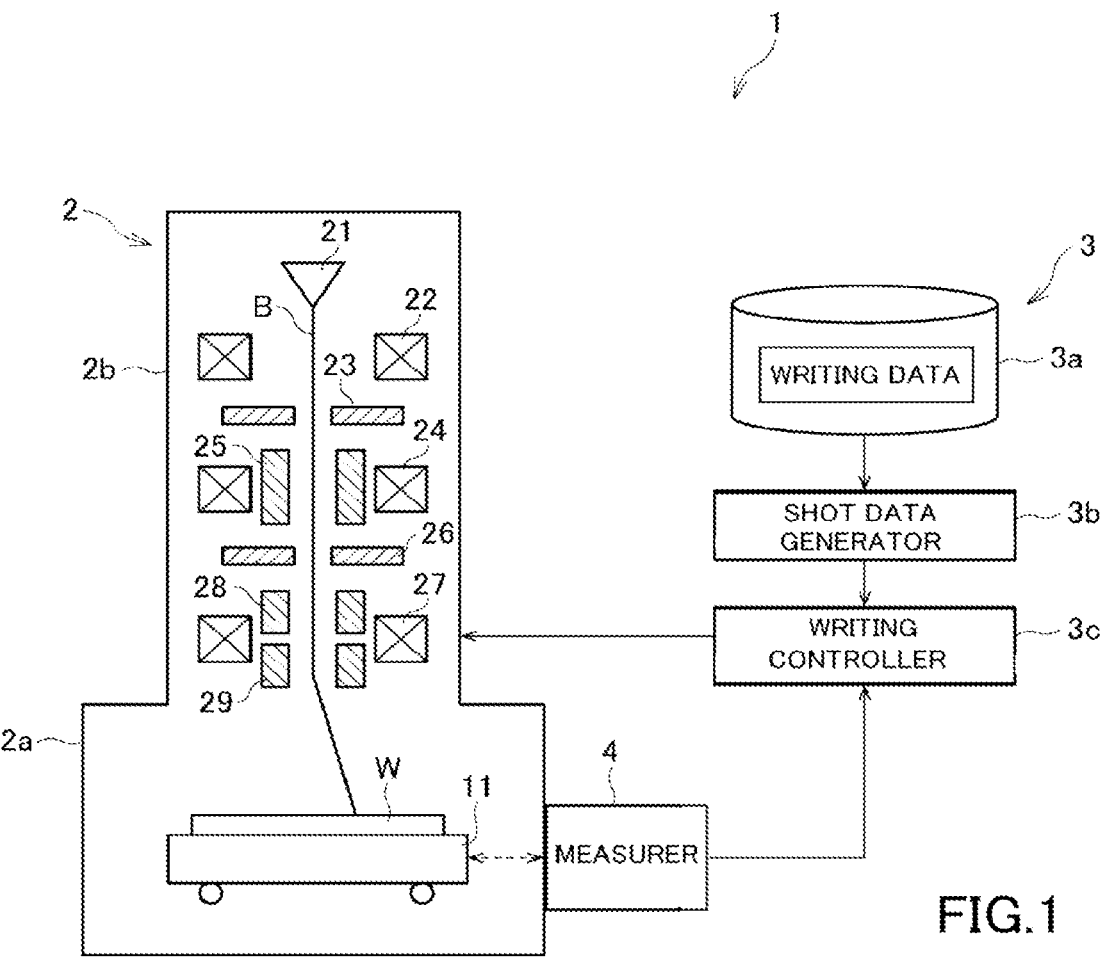
FIG. 1 is a schematic diagram of an electron beam writing apparatus according to an embodiment of the present invention.

FIG. 1 is a schematic diagram of an electron beam writing apparatus according to an embodiment of the present invention. The writing apparatus 1 illustrated in FIG. 1 is a variable mold writing apparatus including a writer 2 that writes a desired pattern by radiating an electron beam to a substrate W as a writing target, and a controller 3 that controls the operation of the writer 2.

The writer 2 has a writing chamber 2a that stores a sample W as a writing target, and an optical column 2b connected to the writing chamber 2a. The optical column 2b is provided in the upper surface of the writing chamber 2a to shape and deflect an electron beam, and radiates the electron beam to the sample W in the writing chamber 2a. The inside of the writing chamber 2a and the optical column 2b is depressurized to achieve a vacuum state.

A stage 11 that supports the sample W is provided in the writing chamber 2a. The stage 11 is movable in X-axis direction and Y-axis direction (hereinafter simply referred to as X direction and Y direction) which are perpendicular to each other in a horizontal plane. For example, the sample W such as mask blanks is placed on the stage 11. The outer periphery of the writing chamber 2a is provided with a measurer 4 that measures the position of the stage 11. The configuration of the measurer 4 will be described below.

In the optical column 2b, an emitting unit 21, such as an electron gun, which emits an electron beam B; an illumination lens 22 that focuses the electron beam B; a first shaping aperture 23 for beam shaping; a projection lens 24; a shaping deflector 25; a second shaping aperture 26 for beam shaping; an objective lens 27 that focuses the beam on the sample W; and a sub-deflector 28 and a main deflector 29 that control the beam shot position relative to the sample W are disposed.

In the writer 2, the electron beam B is emitted from the emitting unit 21, and radiated to the first shaping aperture 23 by the illumination lens 22. The first shaping aperture 23 has, for example, a rectangular opening. When the electron beam B passes through the first shaping aperture 23, the cross-section of the electron beam is shaped to a rectangle, and projected onto the second shaping aperture 26 by the projection lens 24. The projection position is deflectable by the shaping deflector 25, and the shape and dimensions of the electron beam B can be controlled by deflection of the projection position. The electron beam B which has passed through the second shaping aperture 26 is focused and radiated to the sample W on the stage 11 by the objective lens 27. At this point, the shot position of the electron beam B relative to the sample W on the stage 11 is deflected by the sub-deflector 28 and the main deflector 29.

The controller 3 includes a storage 3a that stores writing data, a shot data generator 3b that processes the writing data to generate shot data, and a writing controller 3c that controls the writer 2. Note that the shot data generator 3b and the writing controller 3c may be configured by hardware such as an electric circuit, or may be configured by software such as programs to execute functions, or may be configured by a combination of those.

The writing data is converted to a format for a writing apparatus 1 so that design data (layout data) created by a designer or the like of a semiconductor integrated circuit can be input to the writing apparatus 1, and the writing data is input from an external apparatus and saved in the storage 3a. As the storage 3a, for example, a magnetic disk device and a semiconductor disk device (flash memory) can be used.

Note that the above-mentioned design data normally includes a great number of microscopic patterns (such as figures), and the data size is large. When the design data is converted to another format as it is, the data volume after the conversion further increases. Thus, the writing data is to be compressed in data volume by a method such as hierarchization of data or an array display of a pattern. Such writing data defines a writing pattern of a chip region, or a writing pattern of a virtual chip region which is regarded as one chip by virtually merging a plurality of chip regions in the same writing condition.

The shot data generator 3b divides the writing pattern defined by writing data into a plurality of stripe-shaped (paper strip-shaped) regions (the longitudinal direction is X-direction, the transverse direction is Y-direction), and further divides each stripe region into a large number of sub-regions. The shot data generator 3b determines the shapes, sizes, positions of the figures in each sub-region, and further divides each figure into a plurality of partial regions, each of which is writable by a single shot to generate shot data. Note that the length of each stripe region in the transverse direction (Y-direction) is set to a length by which the electron beam B is deflectable by the main deflection.

When a writing pattern is written, the writing controller 3c positions the electron beam B to each sub-region by the main deflector 29, while moving the stage 11 in the longitudinal direction (X-direction) of the stripe region, and shoots the electron beam B to a predetermined position of the sub-region by the sub-deflector 28 to write a figure. Subsequently, when writing of one stripe region is completed, step movement is made on the stage 11 in the Y-direction and writing of the next stripe region is performed, and writing is performed by repeating this step on the entire writing region of the sample W with the electron beam B. Note that the stage 11 is moved in one direction continuously during writing, thus the writing origin of the sub-region is tracked by the main deflector 29 so that the writing origin follows the movement of the stage 11.

In this manner, the electron beam B is deflected by the sub-deflector 28 and the main deflector 29, and is determined in irradiation position, while following the continuously moving stage 11. The stage 11 is moved continuously in the X-direction, and the shot position of the electron beam B follows the movement of the stage 11, thus the writing time can be reduced.

The writing controller 3c uses positional information of the stage 11, measured by the measurer 4 to control the sub-deflector 28 and the main deflector 29, in other words, control the beam irradiation position.

Figure 2:
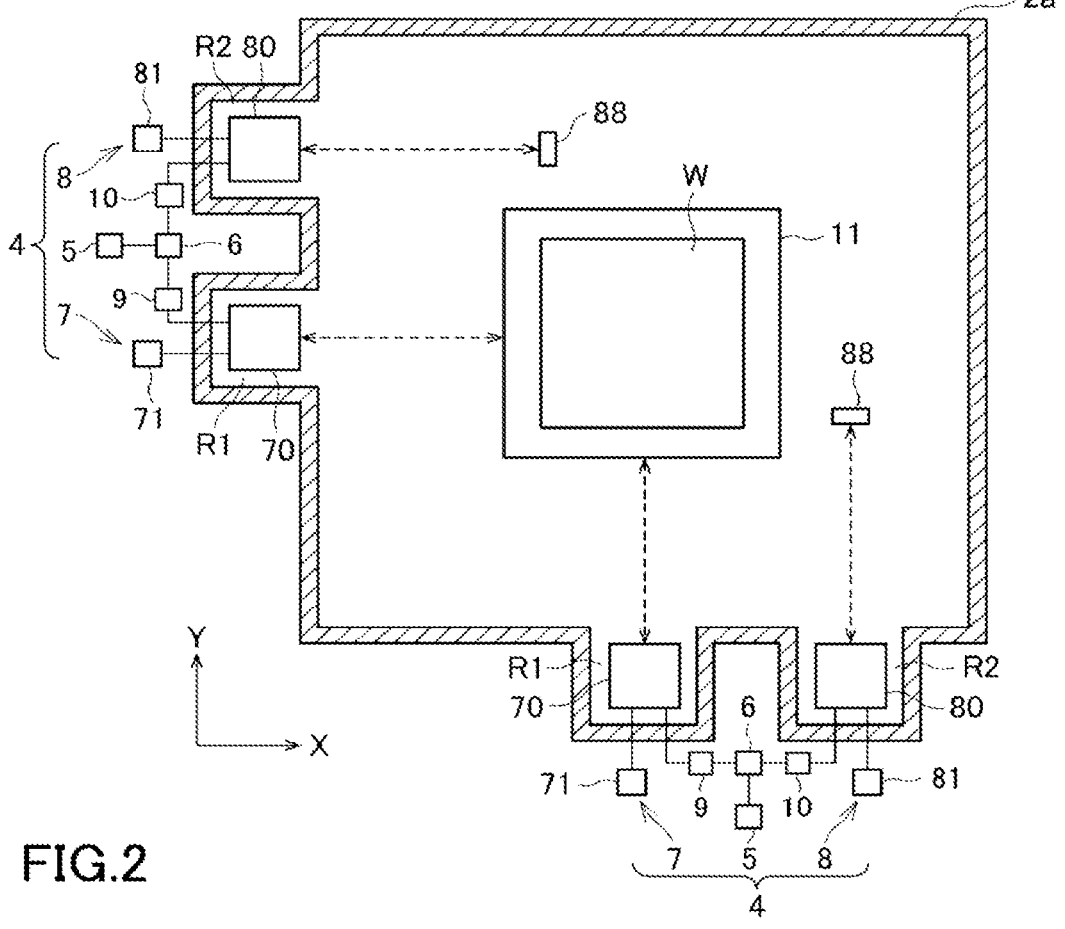
FIG. 2 is a schematic view of a stage and a laser interferometer according to the embodiment.

Next, the configuration of the measurer 4 will be described. As illustrated in FIG. 2, the measurer 4 is provided at two sites, and the measurer 4 (first measurer) located on the lower side of FIG. 2 measures the position of the stage 11 in the Y-direction. In addition, the measurer 4 (second measurer) located on the left side of FIG. 2 measures the position of the stage 11 in the X-direction. These two measurers 4 have the same structure, thus the common structure will be described below.

The measurer 4 includes a laser source 5, a brancher 6 that branches the laser beam emitted from the laser source 5, phase difference plates 9, 10, a length measurer 7 that measures the distance to the stage 11 using a laser beam, and a wall surface displacement measurer 8 that measures a displacement of the wall surface of the writing chamber 2a. As the laser beam, for example, a helium neon laser can be used. As the brancher 6, for example, a half mirror can be used.

The length measurer 7 has a laser interferometer 70 and a light receiver 71. As the light receiver 71, for example, a photodiode can be used. The laser interferometer 70 (first laser interferometer) is stored in a storage chamber R1 formed in the sidewall surface of the writing chamber 2a, and is mounted on the sidewall surface.

The wall surface displacement measurer 8 has a laser interferometer 80, a fixed mirror 88, and a light receiver 81. As the light receiver 81, for example, a photodiode is used. The laser interferometer 80 (second laser interferometer) is stored in a storage chamber R2 formed in the sidewall surface of the writing chamber 2a, and is mounted on the sidewall surface. The fixed mirror 88 is fixed at a predetermined position in the vicinity of the stage 11 in the writing chamber 2a.

The laser source 5, the brancher 6, the phase difference plates 9, 10, the light receiver 71, and the light receiver 81 are provided outside the housing of the writer 2.

The inside of the writing chamber 2a is in a vacuum state, and deformation occurs in the sidewall surface due to an environmental change such as an atmospheric pressure variation and a temperature variation. When an actuator (not illustrated) that drives the stage 11 is fixed to the sidewall surface of the writing chamber 2a, deformation may occur in the sidewall surface by the stage drive reaction force of the actuator. As described above, the laser interferometer 70 of the length measurer 7 that measures the distance to the stage 11 is mounted on the sidewall surface of the writing chamber 2a. Thus, in order to accurately calculate the distance to the stage 11, change in the sidewall surface of the writing chamber 2a needs to be considered. The wall surface displacement measurer 8 in this embodiment measures the change (displacement) of the sidewall surface of the writing chamber 2a.

The laser source 5 emits a laser beam with different frequencies. For example, the laser source 5 emits a laser beam with frequency f1 and a laser beam with frequency f2.

A laser beam with frequencies f1, f2 is branched into sub-laser beams by the brancher 6, and the sub-laser beams travel to the laser interferometers 70, 80, respectively. The phase difference plate 9 (first phase difference plate) is provided on the optical path between the brancher 6 and the laser interferometer 70. The phase difference plate 10 (second phase difference plate) is provided on the optical path between the brancher 6 and the laser interferometer 80. The phase difference plates 9, 10 are, for example, a rotary λ/2 phase difference plate, a rotary λ/4 phase difference plate, and a rotary compensating plate.

The laser beam emitted from the laser source 5 is reflected by a mirror (not illustrated) or the like in order to be guided to the laser interferometers 70, 80. The phase of polarization may be displaced due to the reflection, the frequencies f1 and f2 may be reversed, and noise may occur due to generation of a crosstalk component which accompanies the slope and elliptic state of polarization. The phase difference plates 9, 10 are installed to prevent such a frequency reversal, and to reduce noise. Thus, two frequencies f1, f2 of the laser beam become the same between the laser interferometer 70 and the laser interferometer 80.

As illustrated in FIG. 3A, FIG. 3B, the laser interferometer 70 has a polarizing beam splitter (PBS) 72, and reflecting mirrors 73 and 74.

As illustrated in FIG. 3A, the laser beam (length measuring beam) with the frequency f1 goes straight through a polarization separating surface 72a of the polarizing beam splitter 72, reflects on the reflecting mirror 12 on the stage 11, then successively reflected by the polarization separating surface 72a, the reflecting mirror 73, the reflecting mirror 74, the reflecting mirror 73, and the polarization separating surface 72a, and travels to the reflecting mirror 12. The laser beam reflected again by the reflecting mirror 12 goes straight through the polarization separating surface 72a, and travels to the light receiver 71.

In contrast, as illustrated in FIG. 3B, the laser beam (reference beam) with the frequency f2 successively reflects on the polarization separating surface 72a, the reflecting mirror 74, and the polarization separating surface 72a, then travels to the light receiver 71.

The light receiver 71 detects first synthetic beam in which the measuring beam and the reference beam are synthesized on the same optical axis, and outputs a first beat signal fm.

As illustrated in FIG. 4A, FIG. 4B, the laser interferometer 80 has a polarizing beam splitter (PBS) 82, and reflecting mirrors 83 and 84.

As illustrated in FIG. 4A, the laser beam (length measuring beam) with the frequency f1 goes straight through a polarization separating surface 82a of the polarizing beam splitter 82, reflects on the fixed mirror 88, then successively reflected by the polarization separating surface 82a, the reflecting mirror 83, the reflecting mirror 84, the reflecting mirror 83, and the polarization separating surface 82a, and travels to the fixed mirror 88. The laser beam reflected again by the fixed mirror 88 goes straight through the polarization separating surface 82a, and travels to the light receiver 81.

In contrast, as illustrated in FIG. 4B, the laser beam (reference beam) with the frequency f2 successively reflects on the polarization separating surface 82a, the reflecting mirror 84, and the polarization separating surface 82a, then travels to the light receiver 81.

The light receiver 81 detects second synthetic beam in which the measuring beam and the reference beam are synthesized on the same optical axis, and outputs a second beat signal fr.

The first beat signal fm includes a stage movement component, and a sidewall surface displacement component of the writing chamber 2a. The second beat signal fr corresponds to the sidewall surface displacement component of the writing chamber 2a. A beat signal difference (fm−fr) that is the difference between the first beat signal fm and the second beat signal fr is determined as the stage position (stage movement amount). The difference between the first beat signal fm and the second beat signal fr is determined, thereby making it possible to cancel the sidewall surface displacement component of the writing chamber 2a, and accurately measure the stage movement amount.

The writing controller 3c obtains a result of measurement in the light receivers 71, 81, and determines the stage position from the beat signal difference (fm−fr). The writing controller 3c controls the writer 2 based on the determined stage position, and performs a writing process. Like this, according to this embodiment, the position of the stage 11 can be determined with high accuracy in consideration of the displacement of the sidewall surface of the writing chamber 2a, and the beam can be radiated to a desired position, thus reduction in the writing accuracy can be prevented.

Note that polarization direction is adjusted so that the frequency f1 (stage length measurement frequency) of a laser beam travelling to the stage 11 (the reflecting mirror 12 on the stage 11) matches the frequency f2 (fixed mirror length measurement frequency) of a laser beam travelling to the fixed mirror 88. Thus, the shift directions of a beat signal accompanying the displacement of a length measurement target can be matched between the laser interferometer 70 and the laser interferometer 80.

As described above, in this embodiment, the crosstalk component is reduced by installing the phase difference plates 9, 10 in the previous stage of the laser interferometers 70, 80 so that the frequency f1 of the length measurement beam matches the frequency f2 of the reference beam between the laser interferometer 70 and the laser interferometer 80. In order to reduce the crosstalk component, the phase difference plates 9, 10 need to be adjusted.

The phase difference plates 9, 10 are preferably adjusted without relieving the writing chamber 2a to the atmosphere. Thus, as illustrated in FIG. 5A, FIG. 5B, FIG. 5C, a movable flap phase difference plate 30 (third phase difference plate) is installed on the optical path of the laser beam in the writing chamber 2a, in other words, between the polarizing beam splitter 72 and the reflecting mirror 12 on the stage 11. The phase difference plate 30 is, for example, a λ/4 plate.

Figures 6A, 6B, 6C:
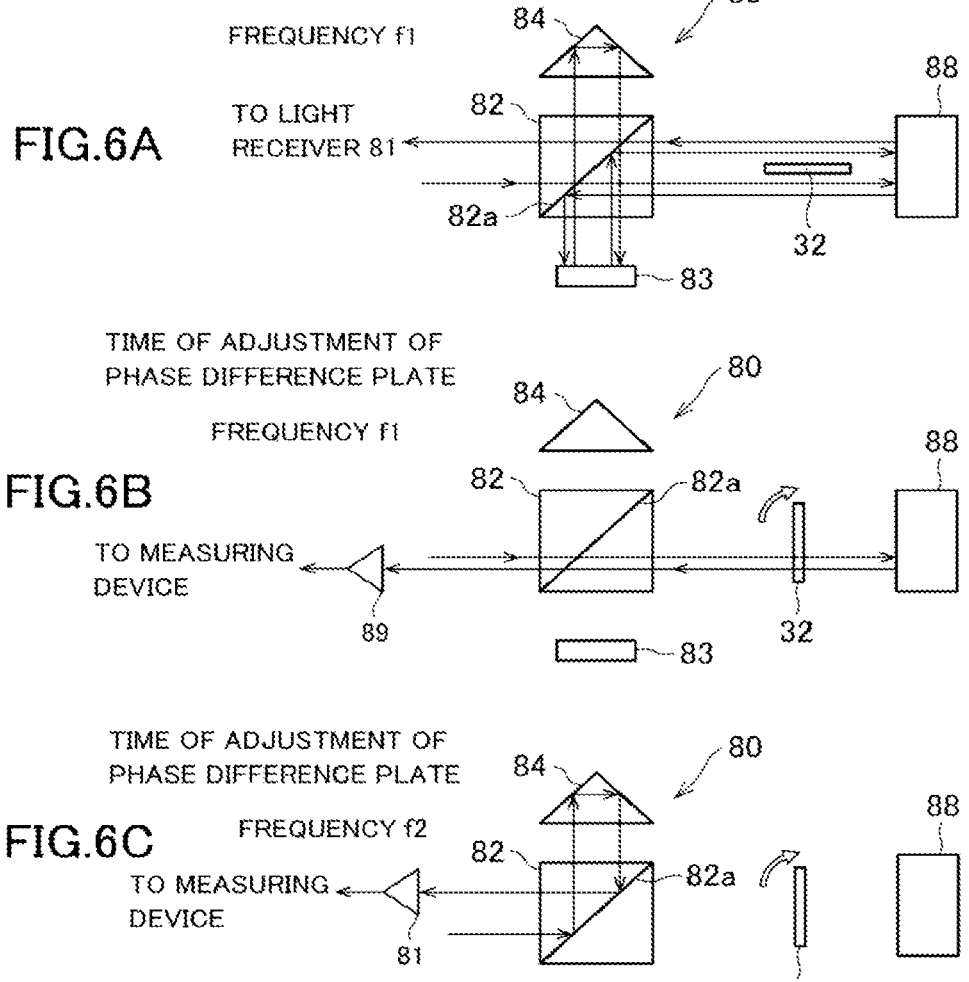
FIG. 6A, FIG. 6B, FIG. 6C are views illustrating an optical path of a laser beam.

In addition, as illustrated in FIG. 6A, FIG. 6B, FIG. 6C, a movable flap phase difference plate 32 (fourth phase difference plate) is installed between the polarizing beam splitter 82 and the fixed mirror 88. The phase difference plate 32 is, for example, a λ/4 plate. The positions of the phase difference plates 30, 32 are controlled by the writing controller 3c.

As illustrated in FIG. 5A, FIG. 6A, at the time of writing process (pattern writing), the phase difference plates 30, 32 are controlled so that the length measurement beam with the frequency f1 does not pass through them.

As illustrated in FIG. 5B, FIG. 5C, FIG. 6B, FIG. 6C, at the time of adjustment of the phase difference plates 9, 10, the phase difference plates 30, 32 are located on the optical path of the length measurement beam with the frequency f1.

As illustrated in FIG. 5B, in the laser interferometer 70, the length measurement beam with the frequency f1 goes straight through the polarization separating surface 72a of the polarizing beam splitter 72, passes through the phase difference plate 30, reflects on the reflecting mirror 12 on the stage 11, passes through the phase difference plate 30, goes straight through the polarization separating surface 72a, and travels to the light receiver 79. A result of measurement in the light receiver 79 is input to a measuring device such as an oscilloscope. As illustrated in FIG. 5C, the reference beam with the frequency f2 successively reflects on the polarization separating surface 72a, the reflecting mirror 74, and the polarization separating surface 72a, then travels to the light receiver 71. A result of measurement in the light receiver 71 is input to a measuring device. Consequently, the length measurement beam with the frequency f1, and the reference beam with the frequency f2 can be separated and measured, and a result of measurement can be input to a measuring device.

As illustrated in FIG. 6B, in the laser interferometer 80, the length measurement light with the frequency f1 goes straight through the polarization separating surface 82a of the polarizing beam splitter 82, passes through the phase difference plate 32, reflects on the fixed mirror 88, passes through the phase difference plate 32, goes straight through the polarization separating surface 82a, and travels to the light receiver 89. A result of measurement in the light receiver 89 is input to a measuring device. As illustrated in FIG. 6C, the reference beam with the frequency f2 successively reflects on the polarization separating surface 82a, the reflecting mirror 84, and the polarization separating surface 82a, then travels to the light receiver 81. A result of measurement in the light receiver 81 is input to a measuring device. Consequently, the length measurement beam with the frequency f1, and the reference beam with the frequency f2 can be separated and measured, and a result of measurement can be input to a measuring device.

When a crosstalk component is contained in the result of measurement of the measuring beam or the reference beam input to the measuring device, not only the frequencies f1, f2 but also the beat signal with the frequency f1-f2 is detected. The phase difference plates 9, 10 are adjusted so that the beat signal strength is reduced while checking the result of the detection by the measuring device. The beat signal strength is adjusted so as to be decreased, for example, by rotating, as the rotational center axis, the axis of an incident beam on the phase difference plates 9, 10 (such as a rotary λ/2 phase difference plate, a rotary λ/4 phase difference plate, and a rotary compensating plate).

In the above embodiment, it is preferable that the laser interferometer 70 and the laser interferometer 80 be closely arranged to have substantially equal wall surface displacements of the writing chamber 2a. Depending on the interval between the laser interferometer 70 and the laser interferometer 80, the difference in the wall surface displacements at the installation position of the laser interferometer 70 and the installation position of the laser interferometer 80 may calculated based on the atmospheric pressure and temperature, and the stage position may be corrected.

In the above embodiment, a configuration has been described in which two phase difference plates 9, 10 are provided between the laser source 5, and the laser interferometers 70, 80, or a configuration may be adopted in which one of the phase difference plates 9, 10 is omitted. Alternatively, the phase difference plates 9, 10 may be omitted, and one phase difference plate may be arranged between the laser source 5 and the brancher 6. In this case, the laser beam emitted from the laser source 5 passes through the phase difference plate, then is branched into sub-laser beams by the brancher 6, and the sub-laser beams are guided to the laser interferometers 70, 80, respectively. The frequency of the laser beam is adjusted by the phase difference plate.

The above embodiment describes a writing apparatus that irradiates electron beams, but it may also irradiate other charged particle beams such as ion beams. The writing apparatus may also be a multi-beam writing apparatus.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing apparatus comprising:
a writer radiating a charged particle beam to a sample to write a pattern, the writer including a writing chamber in which a movable stage for placing the sample is internally installed;
a laser source outputting a laser beam with a first frequency and a second frequency;
a length measurer measuring a position of the stage using the laser beam with the first frequency and the second frequency;
a wall surface displacement measurer measuring a wall surface displacement of the writing chamber using the laser beam with the first frequency and the second frequency; and
a writing controller controlling the writer,
wherein the length measurer includes a first laser interferometer provided in a wall surface of the writing chamber, and detects a first synthetic beam and outputs a first beat signal, the first synthetic beam being obtained by synthesizing a laser beam with the first frequency which has traveled back and forth between the first laser interferometer and the stage, and a laser beam with the second frequency reflected in the first laser interferometer,
the wall surface displacement measurer includes a second laser interferometer provided in the wall surface of the writing chamber, and detects a second synthetic beam and outputs a second beat signal, the second synthetic beam being obtained by synthesizing a laser beam with the first frequency which has traveled back and forth between the second laser interferometer and a fixed mirror fixed at a predetermined position in the writing chamber, and a laser beam with the second frequency reflected in the second laser interferometer, and
the writing controller calculates the position of the stage based on a difference between the first beat signal and the second beat signal.

2. The apparatus according to claim 1,
wherein the laser beam with the first frequency and the second frequency output from the laser source is branched into sub-laser beams by a brancher, and the sub-laser beams are respectively input to the first laser interferometer and the second laser interferometer, and the apparatus further includes at least one of a first phase difference plate provided between the brancher and the first laser interferometer and a second phase difference plate provided between the brancher and the second laser interferometer.

3. The apparatus according to claim 1, wherein the laser beam with the first frequency and the second frequency output from the laser source is branched into sub-laser beams by a brancher, and the sub-laser beams are respectively input to the first laser interferometer and the second laser interferometer, and the apparatus further includes:

a first phase difference plate provided between the brancher and the first laser interferometer;

a second phase difference plate provided between the brancher and the second laser interferometer;

a movable third phase difference plate provided between the first laser interferometer and the stage; and a movable fourth phase difference plate provided between the second laser interferometer and the fixed mirror, wherein the writing controller controls positions of the third phase difference plate and the fourth phase difference plate so that at a time of a writing process, a laser beam with the first frequency does not pass through the third phase difference plate and the fourth phase difference plate, and at a time of adjustment of the first phase difference plate and the second phase difference plate, the laser beam with the first frequency passes through the third phase difference plate and the fourth phase difference plate.

4. The apparatus according to claim 3, wherein the third phase difference plate and the fourth phase difference plate are flap phase difference plates.

5. The apparatus according to claim 3, wherein a laser beam with the first frequency which has passed through the third phase difference plate, and traveled back and forth between the first laser interferometer and the stage, and a laser beam with the second frequency reflected in the first laser interferometer are detected by different light receivers.

6. A charged particle beam writing method comprising:

outputting a laser beam with a first frequency and a second frequency from a laser source;

detecting a first synthetic beam and outputting a first beat signal using a first laser interferometer provided in a wall surface of a writing chamber in which a movable stage for placing a sample is internally installed, the first synthetic beam being obtained by synthesizing a laser beam with the first frequency which has traveled back and forth between the first laser interferometer and the stage, and a laser beam with the second frequency reflected in the first laser interferometer;

detecting a second synthetic beam and outputting a second beat signal using a second laser interferometer provided in the wall surface of the writing chamber, the second synthetic beam being obtained by synthesizing a laser beam with the first frequency which has traveled back and forth between the second laser interferometer and a fixed mirror fixed at a predetermined position in the writing chamber, and a laser beam with the second frequency reflected in the second laser interferometer;

calculating a position of the stage based on a difference between the first beat signal and the second beat signal; and controlling a writer based on the calculated position of the stage, and radiating a charged particle beam to the sample to write a pattern.

7. The method according to claim 6, wherein the laser beam with the first frequency and the second frequency output from the laser source is branched into sub-laser beams by a brancher, and the method further includes at least one of a step of passing one of the branched sub-laser beams through a first phase difference plate provided between the brancher and the first laser interferometer and a step of passing the other of the branched sub-laser beams through a second phase difference plate provided between the brancher and the second laser interferometer.

8. The method according to claim 7, further comprising:

branching the laser beam with the first frequency and the second frequency output from the laser source into sub-laser beams by a brancher;

passing one of the branched sub-laser beams through the first phase difference plate provided between the brancher and the first laser interferometer;

passing the other of the branched sub-laser beams through the second phase difference plate provided between the brancher and the second laser interferometer; and controlling a position of a movable third phase difference plate provided between the first laser interferometer and the stage, and a position of a movable fourth phase difference plate provided between the second laser interferometer and the fixed mirror, wherein at a time of a writing process, the third phase difference plate and the fourth phase difference plate are controlled in position so that a laser beam with the first frequency does not pass through the third phase difference plate and the fourth phase difference plate, and and at a time of adjustment of the first phase difference plate and the second phase difference plate, the third phase difference plate and the fourth phase difference plate are controlled in position so that a laser beam with the first frequency passes through the third phase difference plate and the fourth phase difference plate.

9. A phase difference plate adjustment method for adjusting the first phase difference plate of the charged particle beam writing apparatus according to claim 2, wherein a position of a movable third phase difference plate provided between the first laser interferometer and the stage is controlled so that at a time of a writing process, a laser beam with the first frequency is not allowed to pass through the third phase difference plate, and at a time of adjustment of the first phase difference plate, a laser beam with the first frequency is allowed to pass through the third phase difference plate, and the laser beam with the first frequency which has passed through the third phase difference plate, and traveled back and forth between the first laser interferometer and the stage, and a laser beam with the second frequency reflected in the first laser interferometer are separated and measured, and the first phase difference plate is adjusted based on a result of measurement.

10. A phase difference plate adjustment method for adjusting the second phase difference plate of the charged particle beam writing apparatus according to claim 2, wherein a position of a movable fourth phase difference plate provided between the second laser interferometer and the fixed mirror is controlled so that at a time of a writing process, a laser beam with the first frequency is not allowed to pass through the fourth phase difference plate, and at a time of adjustment of the second phase difference plate, a laser beam with the first frequency is allowed to pass through the fourth phase difference plate, and the laser beam with the first frequency which has passed through the fourth phase difference plate, and traveled back and forth between the second laser interferometer and the fixed mirror, and a laser beam with the second frequency reflected in the second laser interferometer are separated and measured, and the second phase difference plate is adjusted based on a result of measurement.

11. The method according to claim 10, wherein the charged particle beam writing apparatus is provided with the first phase difference plate and the second phase difference plate, a position of a movable third phase difference plate provided between the first laser interferometer and the stage is controlled so that at a time of a writing process, a laser beam with the first frequency is not allowed to pass through the third phase difference plate, and at a time of adjustment of the first phase difference plate, the laser beam with the first frequency is allowed to pass through the third phase difference plate, and the laser beam with the first frequency which has passed through the third phase difference plate, and traveled back and forth between the first laser interferometer and the stage, and a laser beam with the second frequency reflected in the first laser interferometer are separated and measured, and the first phase difference plate is adjusted based on a result of measurement.

12. The method according to claim 11, wherein the laser beam with the first frequency which has passed through the third phase difference plate, and traveled back and forth between the first laser interferometer and the stage, and the laser beam with the second frequency reflected in the first laser interferometer are separated and measured, a beat signal having a difference frequency between the first frequency and the second frequency is detected, and the first phase difference plate is adjusted so that an intensity of the beat signal is reduced.

\* \* \* \* \*